March 10, 1959 J. E. BRYDEN 2,877,349
FREQUENCY CONTROL OF ELECTRIC OSCILLATION GENERATORS
Filed April 7, 1955
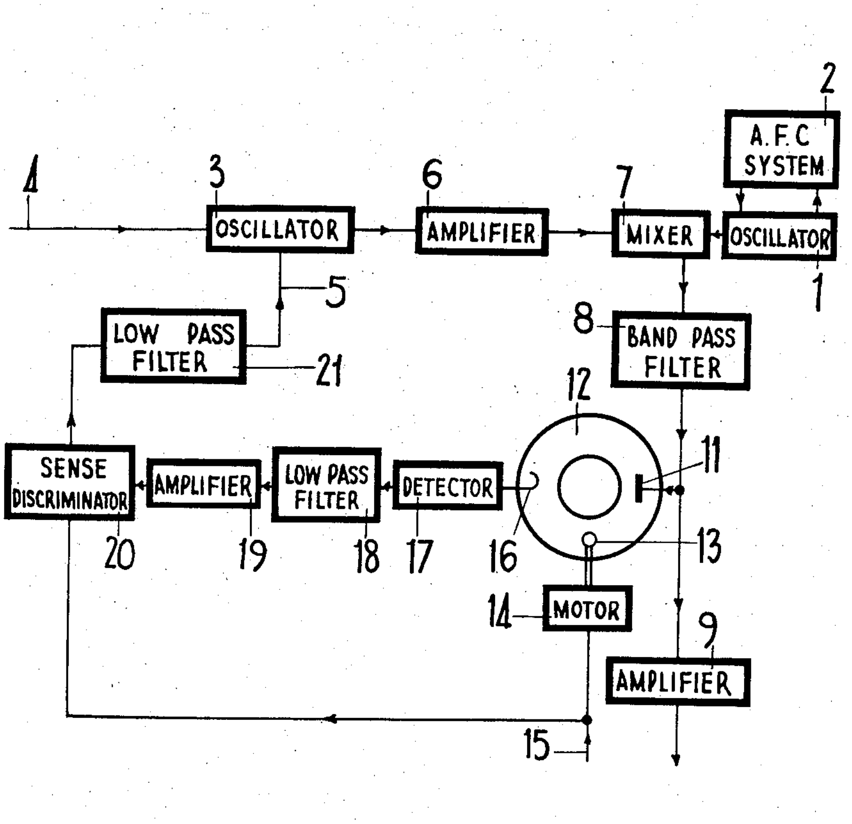
INVENTOR
Joseph Easto Bryden
BY [signature]
ATTORNEY United States Patent Office 2,877,349
Patented Mar. 10, 1959

2,877,349

FREQUENCY CONTROL OF ELECTRIC OSCILLATION GENERATORS

Joseph Easto Bryden, Montreal, Quebec, Canada, assignor to The General Electric Company Limited, London, England Application April 7, 1955, Serial No. 499,981

Claims priority, application Great Britain April 9, 1954

3 Claims. (Cl. 250—36)

The present invention relates to electric oscillation generators. More particularly the invention is concerned with controlling the mean operating frequency of oscillation generators of the kind that are adapted to supply angle modulated oscillations, for example frequency or phase modulated oscillations.

It is known to apply the output from an oscillation generator that is adapted to supply frequency or phase modulated oscillations to a frequency discriminator and to derive from the discriminator a steady voltage that is approximately proportional to the difference between the mean operating frequency of the generator and the frequency to which the discriminator is tuned. This voltage may be utilised to control the mean operating frequency of the oscillation generator so as to reduce this difference but, especially in the case of an arrangement in which the discriminator is designed to be capable of handling a large range of input frequencies, the magnitude of the control voltage for a given change of mean operating frequency of the oscillation generator is relatively small. In other words, the automatic frequency control system is somewhat insensitive. It will be appreciated that, if an amplifier were to be provided for the purpose of amplifying the control voltage, the amplifier would have to be of the so-called D. C. type, and that, since such amplifiers are often liable to drift, the overall accuracy of the frequency control system would be reduced.

Moreover frequency discriminators that are capable of handling a large range of input frequencies usually have relatively poor centre frequency stability and are thus not particularly suitable for providing a reference frequency.

One object of the present invention is to provide an oscillation generator with an improved automatic frequency control system.

According to the present invention, an electric oscillation generator comprises means which is adapted to supply a frequency or phase modulated electric oscillation and which comprises an oscillator, a resonant device to which is arranged to be supplied the output of the oscillation generator, this device having means periodically to vary its resonant frequency over a range of frequencies, means to supply a signal the amplitude of which is dependent upon the amplitude of the component of the amplitude modulation on the oscillatory current in, or voltage across, the resonant device that has a frequency equal to the frequency at which the resonant frequency of the device is varied as aforesaid, and means to derive from this signal a control signal that is utilised to control the frequency of said oscillator whereby the mean frequency of said frequency or phase modulated oscillation is determined by the mean resonant frequency of the said device.

The resonant device is preferably a resonator and may, for example, be a cavity resonator or an enclosed coaxial line system. A cavity resonator is one adapted to be excited so as to operate effectively as a closed section of waveguide while an enclosed coaxial line system may be considered as a cavity which has a central conductor and which is arranged to be excited so as to operate as a length of coaxial line which is usually short-circuited at one end and open-circuited at the other. In either case, the means for periodically varying the resonant frequency of the resonator may comprise a rotatable member mounted within the resonator and associated means for causing that member to rotate. This associated means may be an electric motor which is adapted to cause the member to rotate at a predetermined speed. This rotatable member may be a disc and, if it is of metal, it may vary the resonant frequency of the resonator during operation by disturbing the magnetic field therein. Alternatively it may be of suitable dielectric material, in which case it causes the electric field to be disturbed.

The means which is adapted to supply the frequency or phase modulated electric oscillation may be formed solely by the said oscillator, or alternatively it may consist of the oscillator in combination with a frequency changer.

One example of an electric oscillation generator in accordance with the present invention will now be described with reference to the accompanying diagrammatic drawing.

This oscillation generator is required to supply a frequency modulated oscillation having a mean frequency in the region of 2,000 megacycles per second. Referring now to the drawing, the generator comprises an oscillator 1 that is provided with its own automatic frequency control system 2 so that it operates at a predetermined frequency of, say 2,000 megacycles per second together with another oscillator 3 which is adapted to effect frequency modulation and which is arranged to operate at a relatively lower mean frequency of, say, 30 megacycles per second. The modulation signal supplied to the oscillator 3 over a path 4 may cover the frequency band between 30 kilocycles per second and 1 megacycle per second, and the mean operating frequency of this oscillator is controlled by supplying a steady control voltage to it over a path 5, this control voltage being derived as hereinafter described.

The output from the frequency modulated oscillator 3 is passed through an amplifier 6 to a mixer 7 to which is also supplied the output from the oscillator 1. In addition, a frequency doubler stage may be provided between the oscillator 3 and the mixer 7.

A band-pass filter 8 is arranged to select the desired side band from the output of the mixer 7 and the signal passed by this filter is fed to a high frequency amplifier 9. The signal passed by this amplifier 9 constitutes the output from the oscillation generator and may be supplied to an aerial (not shown) for transmission over a radio link.

A portion of the output from the filter 8 is supplied to an input probe 11 of a resonator 12 which provides a reference frequency for the automatic frequency control system under consideration. The mean resonant frequency of the resonator 12 is equal to the desired mean frequency of the output oscillation from the oscillation generator.

The resonant frequency of the resonator 12 is varied over a range of frequencies, for example 4 megacycles per second on either side of its mean resonant frequency, fifty times a second by rotating a disc 13 in the cavity of the resonator. The disc 13 is rotated by means of a synchronous electric motor 14 that is fed from a 50 cycle per second supply 15. The signal picked up by a coupling loop 16 that projects into the cavity is fed to a crystal detector 17 and the output from this detector is passed to a low-pass filter 18 that has its cut-off frequency between 50 and 100 cycles per second. It will be realised that the output from this filter 18 consists of an oscillation having a frequency of 50 cycles per second and this oscillation is passed through an amplifier 19 to a sense discriminator 20 where it is compared with the 50 cycles per second supply 15.

Since the angular position of the disc 13 is unambiguously determined at any instant by the phase of the alternating current supply 15, it will be realised that the phasing of the oscillation passed by the amplifier 19 will have one of two values depending upon whether the mean frequency of the oscillation supplied to the resonator 12 is greater or less than the mean resonant frequency of the resonator. The two values of phasing are arranged to be 90 electrical degrees leading and lagging on the alternating current supply 15 and, in order to obtain this relative phasing, it may be necessary to provide a phase-shift network between the amplifier 19 and the discriminator 20. Alternatively the motor 14 may be mounted so that it may be turned relative to the resonator 12 for the purpose of obtaining this phase relationship.

The sense discriminator 20 is of known construction and includes a rectifier (not shown) so that the steady voltage supplied thereby has an amplitude and sense dependent upon the amplitude and phasing of the oscillation passed to the discriminator 20 by the amplifier 19. This voltage, after being smoothed by a low pass filter 21, constitutes the said control voltage that is utilised to vary the mean operating frequency of the frequency modulated oscillator 3.

I claim:

1. An electric oscillation generator comprising a first oscillator to supply an unmodulated oscillation having substantially a predetermined frequency greater than 1000 megacycles per second, a second oscillator to supply an angle modulated oscillation having a mean frequency that is less than 100 megacycles per second, an input path which is connected to the second oscillator for supplying a modulation signal to that oscillator for the purpose of modulating the oscillation supplied thereby, means to produce a derived angle modulated oscillation which constitutes the output of the generator by heterodyning together the oscillations supplied by the two said oscillators, a resonator, a path to supply a portion of the said derived oscillation to the resonator, a circular disc, means to mount said disc to lie wholly within the resonator, means to rotate the said disc about a diameter thereof so as to cause the instantaneous resonant frequency of the resonator to be varied and means to control the mean frequency of the said second oscillator in dependence upon the component of the amplitude modulation on the oscillatory field in the resonator that has a frequency equal to the frequency at which the resonant frequency of hhe resonator is varied so as to cause the mean frequency of the derived oscillation to be substantially equal to the mean resonant frequency of the resonator.

2. An electric oscillation generator according to claim 1 wherein the said means to control the mean frequency of the second oscillator comprises a detector, a coupling loop which is connected to the detector and which projects into the resonator, a low-pass filter which is connected to the detector so as to pass an oscillation having a frequency equal to that at which the resonant frequency of the resonator is varied, a sense discriminator which is responsive to the oscillation passed by the said low-pass filter and which supplies a steady voltage the amplitude and sense of which are dependent upon the amplitude and phasing of the oscillation passed by the said filter, and a path connected between the sense discriminator and the said second oscillator whereby the said steady voltage supplied by the sense discriminator is arranged to control the mean frequency of the oscillator.

3. An electric oscillation generator according to claim 1 wherein the said first oscillator is provided with its own automatic frequency control system.

References Cited in the file of this patent

UNITED STATES PATENTS

| | | |
|---|---|---|
| 2,404,568 | Dow | July 23, 1946 |
| 2,462,294 | Thompson | Feb. 22, 1949 |
| 2,630,488 | Clogston | Mar. 3, 1953 |
| 2,686,875 | Grant | Aug. 17, 1954 |
| 2,709,786 | Warriner | May 31, 1955 |

FOREIGN PATENTS

| | | |
|---|---|---|
| 626,595 | Great Britain | July 18, 1949 |